(12) United States Patent
Flack (10) Patent No.: US 9,024,685 B2
(45) Date of Patent: May 5, 2015

(54) PILOT SIGNAL GENERATION CIRCUIT

(71) Applicant: AeroVironment, Inc., Monrovia, CA (US)

(72) Inventor: Albert Flack, Lake Arrowhead, CA (US)

(73) Assignee: AeroVironment, Inc., Monrovia, CA (US)

( * ) Notice: Subject to any disclaimer, the term of this patent is extended or adjusted under 35 U.S.C. 154(b) by 0 days.

(21) Appl. No.: 14/095,945

(22) Filed: Dec. 3, 2013

(65) Prior Publication Data

US 2014/0176236 A1 Jun. 26, 2014

Related U.S. Application Data

(63) Continuation of application No. 13/651,418, filed on Oct. 14, 2012, now Pat. No. 8,618,877, which is a continuation of application No. PCT/US2011/032579, filed on Apr. 14, 2011, now Pat. No. 8,618,877.

(Continued)

(51) Int. Cl.
*H03F 3/45* (2006.01)
*B60L 3/00* (2006.01)
*H02H 9/08* (2006.01)
(Continued)

(52) U.S. Cl.
CPC ... *H03F 3/45* (2013.01); *B60L 3/00* (2013.01); *B60L 3/0069* (2013.01); *H02H 9/08* (2013.01); *H02J 7/0029* (2013.01); *H03F 1/3235* (2013.01)

(58) Field of Classification Search
USPC .......................... 330/10, 51, 69, 85, 109, 260
See application file for complete search history.

(56) References Cited

U.S. PATENT DOCUMENTS

| | | | |
|---|---|---|---|
| 5,594,321 A | 1/1997 | Kohl et al. | |
| 5,861,775 A * | 1/1999 | Chen et al. | ...................... 330/69 |
| 6,448,856 B2 | 9/2002 | Noro et al. | |

(Continued)

FOREIGN PATENT DOCUMENTS

| | | |
|---|---|---|
| CN | 1714507 A | 12/2005 |
| CN | 101404443 A | 4/2009 |

(Continued)

OTHER PUBLICATIONS

International Searching Authority (ISA/US); International Search Report (ISR) for parent PCT case application No. PCT/US2011/032579 entitled Pilot Signal Generation Circuit by Flack; mailed Apr. 14, 2011 from US International Searching Authority /US; 2 pgs.

(Continued)

*Primary Examiner* — Khanh V Nguyen
(74) *Attorney, Agent, or Firm* — Christopher R. Balzan; Eric J. Aagaard (57) ABSTRACT

In some embodiments, a pilot signal generation circuit is provided including a buffer and a differential amplifier responsive to an output of the buffer. A first transistor is connected to control a reference voltage at an input of the buffer in response to a pulse width modulated logic signal and a second transistor connected to control a reference voltage at an input of the differential amplifier based on the pulse width modulated logic signal such that the second transistor is connected so as to turn on when the first transistor is turned off and to turn off when the first transistor is turned on. The differential amplifier is configured to provide at an output a pilot signal proportional to a gain of the differential amplifier.

6 Claims, 8 Drawing Sheets

Related U.S. Application Data (60) Provisional application No. 61/324,296, filed on Apr. 14, 2010, provisional application No. 61/374,612, filed on Aug. 18, 2010, provisional application No. 61/324,293, filed on Apr. 14, 2010.

(51) Int. Cl.
*H02J 7/00* (2006.01)
*H03F 1/32* (2006.01)

(56) References Cited

U.S. PATENT DOCUMENTS

| 7,113,031 | B2 | 9/2006 | Rabary et al. |
| 7,965,139 | B1 | 6/2011 | Shook |
| 2004/0130326 | A1 | 7/2004 | Yamamoto |
| 2005/0200998 | A1 | 9/2005 | Rowan |
| 2008/0265793 | A1 | 10/2008 | Gurr |

FOREIGN PATENT DOCUMENTS

| EP | 0080278 A1 | 6/1983 |
| WO | WO 89/11587 A1 | 11/1989 |

OTHER PUBLICATIONS

International Searching Authority (ISA/US); Written Opinion (WO) for parent PCT case application No. PCT/US2011/032579 entitled Pilot Signal Generation Circuit by Flack; mailed Apr. 14, 2011 from US International Searching Authority /US; 4 pgs.

International Searching Authority (ISA/US); Examiner's Search History for parent PCT case application No. PCT/US2011/032579 entitled Pilot Signal Generation Circuit by Flack; mailed Apr. 14, 2011 from US International Searching Authority /US; 14 pgs.

The State Intellectual Property Office of the People's Republic of China (SIPO); English translation of First Office Action (OA) for corresponding Chinese case application No. 201180029406.7 entitled Pilot Signal Generation Circuit by Albert Flack; mailed Aug. 20, 2014, from The State Intellectual Property Office of the People's Republic of China; 11 pgs.

The State Intellectual Property Office of the People's Republic of China (SIPO); English translation of Search Report (Search_Rpt) for corresponding Chinese case application No. 201180029406.7 entitled Pilot Signal Generation Circuit By Albert Flack; mailed Aug. 20, 2014, from The State Intellectual Property Office of the People's Republic of China; 2 pgs.

* cited by examiner

PILOT SIGNAL GENERATION CIRCUIT

CROSS REFERENCE TO RELATED APPLICATIONS

The following application is a continuation of U.S. patent application Ser. No. 13/651,418, filed 14 Oct. 2012, by Flack, entitled PILOT SIGNAL GENERATION CIRCUIT, which is a continuation of PCT/US2011/032579 by Flack, entitled PILOT SIGNAL GENERATION CIRCUIT, filed on 14 Apr. 2011, both herein incorporated by reference in their entireties, which claim to the benefit of the following U.S. Provisional Patent Applications, which are herein incorporated by reference in their entireties:

U.S. Provisional Application 61/324,293, by Albert Flack, filed 14 Apr. 2010, entitled PILOT SIGNAL GENERATION CIRCUIT;

U.S. Provisional Application 61/324,296, by Albert Flack, filed 14 Apr. 2010, entitled GROUND FAULT INTERRUPT CIRCUIT FOR ELECTRIC VEHICLE; and U.S. Provisional Application 61/374,612, Albert Flack, filed 18 Aug. 2010, entitled GROUND FAULT INTERRUPT AUTOMATIC TEST METHOD FOR ELECTRIC VEHICLE.

BACKGROUND

Applicable to electric vehicles, the SAE J-1772 standard requires that the pilot signal, which communicates information between the battery charger and the electric supply, is to be composed of certain specific voltage levels. The method of creating these voltages is to start with a known accurate +/−12 volt source and modify its voltage using resistive elements. Most circuits that create the base 12 volt signal use inserted control devices such as transistors which apply current related voltage loss to the source signal making it less accurate and contributing to possible reading errors. What is needed is an improved more accurate pilot signal.

SUMMARY

In some embodiments, a pilot signal generation circuit is provided including a buffer and a differential amplifier responsive to an output of the buffer. A first transistor is connected to control a reference voltage at an input of the buffer in response to a pulse width modulated logic signal and a second transistor connected to control a reference voltage at an input of the differential amplifier based on the pulse width modulated logic signal such that the second transistor is connected so as to turn on when the first transistor is turned off and to turn off when the first transistor is turned on. The differential amplifier is configured to provide at an output a pilot signal proportional to a gain of the differential amplifier.

In various embodiments, the second transistor is connected to an output of the first transistor so as to be responsive to the output of the first transistor to control the reference voltage at the input of the differential amplifier.

BRIEF DESCRIPTION OF THE DRAWINGS

The features and advantages of the present invention will be better understood with regard to the following description, appended claims, and accompanying drawings where:

DESCRIPTION

Figure 1:
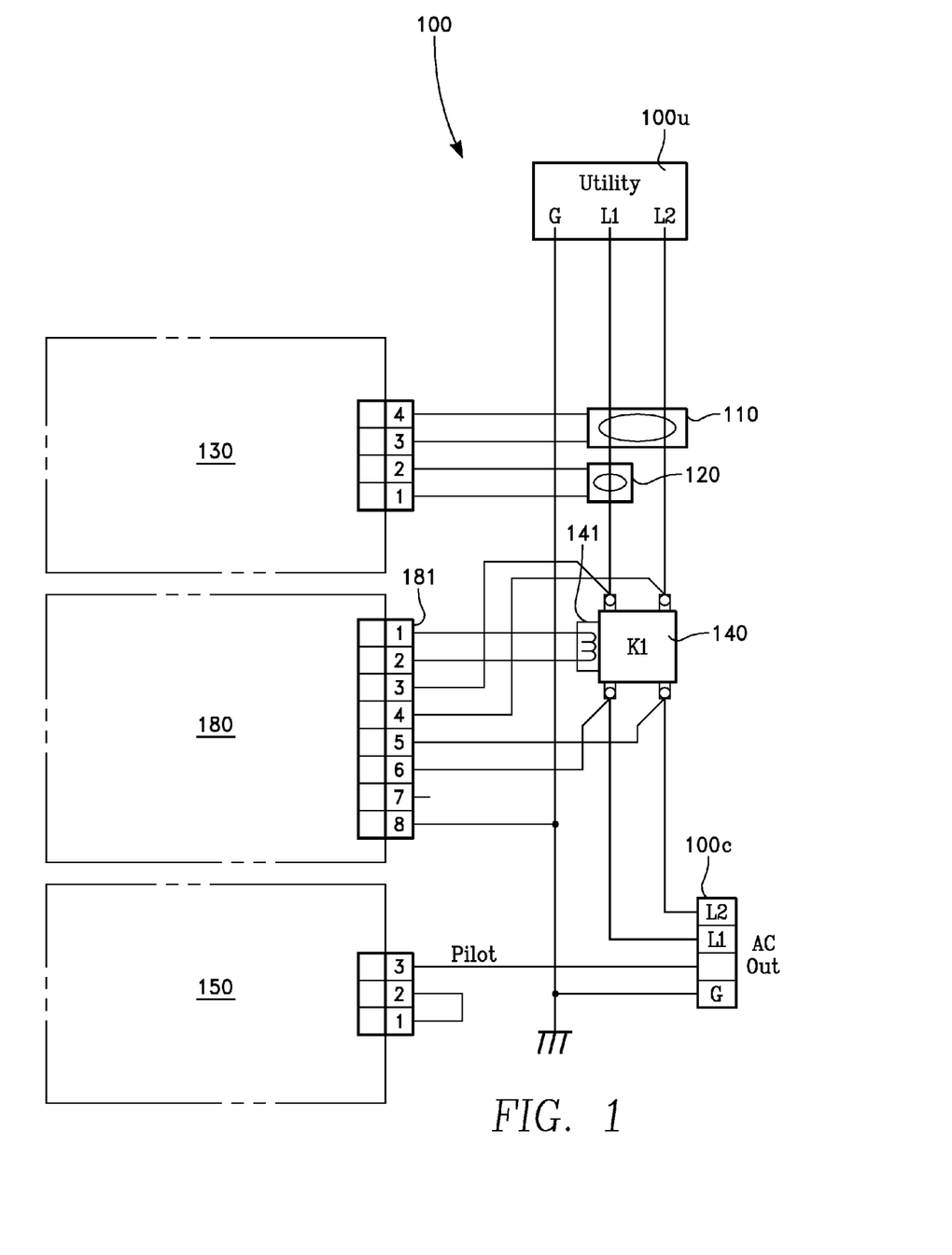
FIG. 1 shows a schematic view of a cable to connect utility power to an electric vehicle (not shown) along with some associated circuitry.

FIG. 1 shows a schematic view of a cable 100 to connect utility power to an electric vehicle (not shown) along with some associated circuitry. In the embodiment of FIG. 1, the cable 100 contains L1 and L2 and ground G lines. The cable 100 connects to utility power at one end 100u and to an electric vehicle (not shown) at the other end 100c. The electric vehicle (not shown) could have an onboard charger, or, the electric vehicle end 100c of the cable 100 could be connected to a separate, optionally free standing, charger (not shown). The separate charger (not shown) would in turn be connected to the electric vehicle for charging onboard batteries, or other charge storage devices. In other embodiments not shown, a charger could be integrated into the cable 100, if desired.

GFI Circuit

FIGS. 1-5

The cable 100 contains current transformers 110 and 120. The current transformer 110 is connected to a ground fault interrupt or GFI circuit 130 which is configured to detect a differential current in the lines L1 and L2 and indicate when a ground fault is detected. Contactor 140 may be open circuited in response to a detected ground fault to interrupt utility power from flowing on lines L1 and L2 to the vehicle (not shown).

Figure 2:
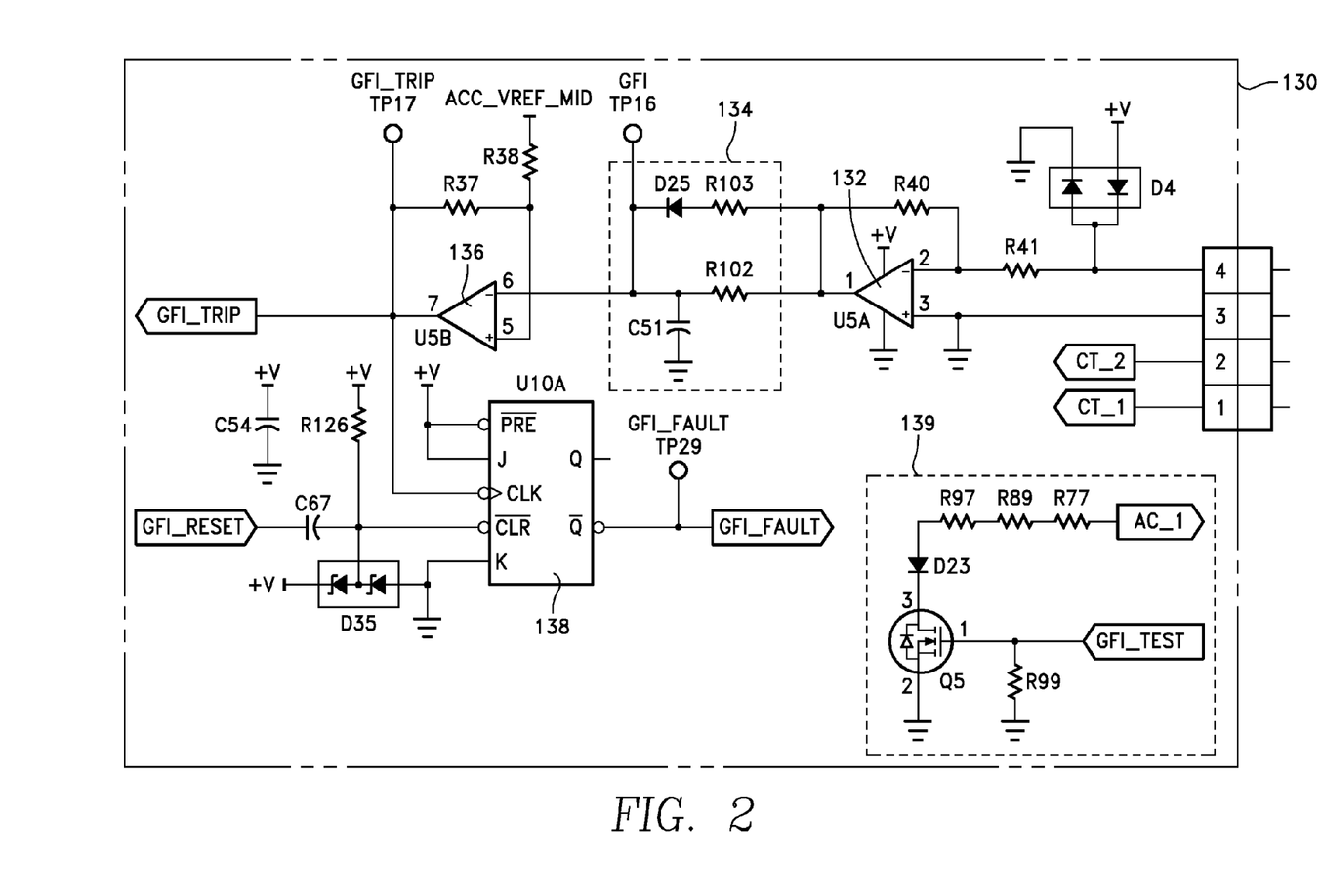
FIG. 2 shows an enlarged view schematic drawing of the GFI circuit of FIG. 1.

FIG. 2 shows an enlarged view schematic drawing of the GFI circuit 130 of FIG. 1. In the embodiment of FIG. 2, the GFI circuit 130 is designed to trip in the 5-20 mA range for GFI in accordance with the UL 2231 standard.

A signal provided by current transformer 110 (FIG. 1) at pins 3 and 4 of the GFI circuit 130 is amplified by op amp 132 to a voltage reference. That voltage reference is filtered by a double stage RC filter 134 to eliminate spurious noise spikes.

Fault current detected by current transformer 110 (FIG. 1) is converted to voltage by gain amplifier 134 for comparison by comparator 136. The output of the gain amplifier 132 is filtered prior to being supplied to the comparator 136 with the double stage RC filter 134 to remove spurious noise that could cause nuisance shut downs. Output of comparator 136 is latched with flip-flop 138 so that contactor 140 (FIG. 1) does not close after a fault has been detected. The comparator 136 provides a GFI_TRIP signal output, which is an input to the fault latch 138 to produce a latched GFI_FAULT signal.

The double stage filter 134 provides a delay so that the shut-off circuit does not immediately shut off if a fault is detected. The double stage filter 134 is a half-wave rectified circuit that allows an incoming pulse width that is less than 50% in some embodiments, or even as small as about 38% in some embodiments, to accumulate over time so that it will charge at a faster rate than it discharges. The double stage filter 134 accumulates charge and acts an energy integrator. Thus, the GFI circuit 130 waits a time period before causing shut down. This is because it is not desirable to have an instantaneous shut down that can be triggered by noise in the lines L1 or L2, or in the GFI circuit 130. The GFI circuit 130 should trip only if a spike has some predetermined duration. In the embodiment shown, that duration is one to two cycles.

The filter 134 charges through R102 and R103. When it discharges, it only discharges through R102, so it charges more current than it discharges over time. The double stage filter 134 is a half wave rectified circuit due to diode D25.

Diodes D4 provide surge suppression protection. In typical embodiments, the gain amplifier 132 may actually have surge suppression protection. Despite this, diodes D4 are added to provide external redundant protection to avoid any damage to the gain amplifier 132. This redundant protection is significant, because if the 132 gain amplifier is damaged, the GFI protection circuit 130 may not function, resulting in inadequate GFI protection for the system. For example, without the redundant surge suppressing diodes D4, if a power surge were to damage the gain amplifier 132 so that it no longer provided output, the GFI circuit 130 would no longer be able to detect faults. Since UL 2231 allows utility power L1 and L2 power to be reconnected after a GFI circuit detects a ground fault surge, utility power L1 and L2 could conceivably be reconnected after the gain amplifier 132 had been damaged. It is significant to note that the diodes D4 are connected to the upper and lower reference voltage busses of the circuit, i.e. ground and 3 volts, respectively, so that they can easily dissipate surge current without causing damage to the circuitry. Thus, the redundant surge suppression diodes D4 provide an additional safety feature for the GFI protection circuit 130.

Figure 3:
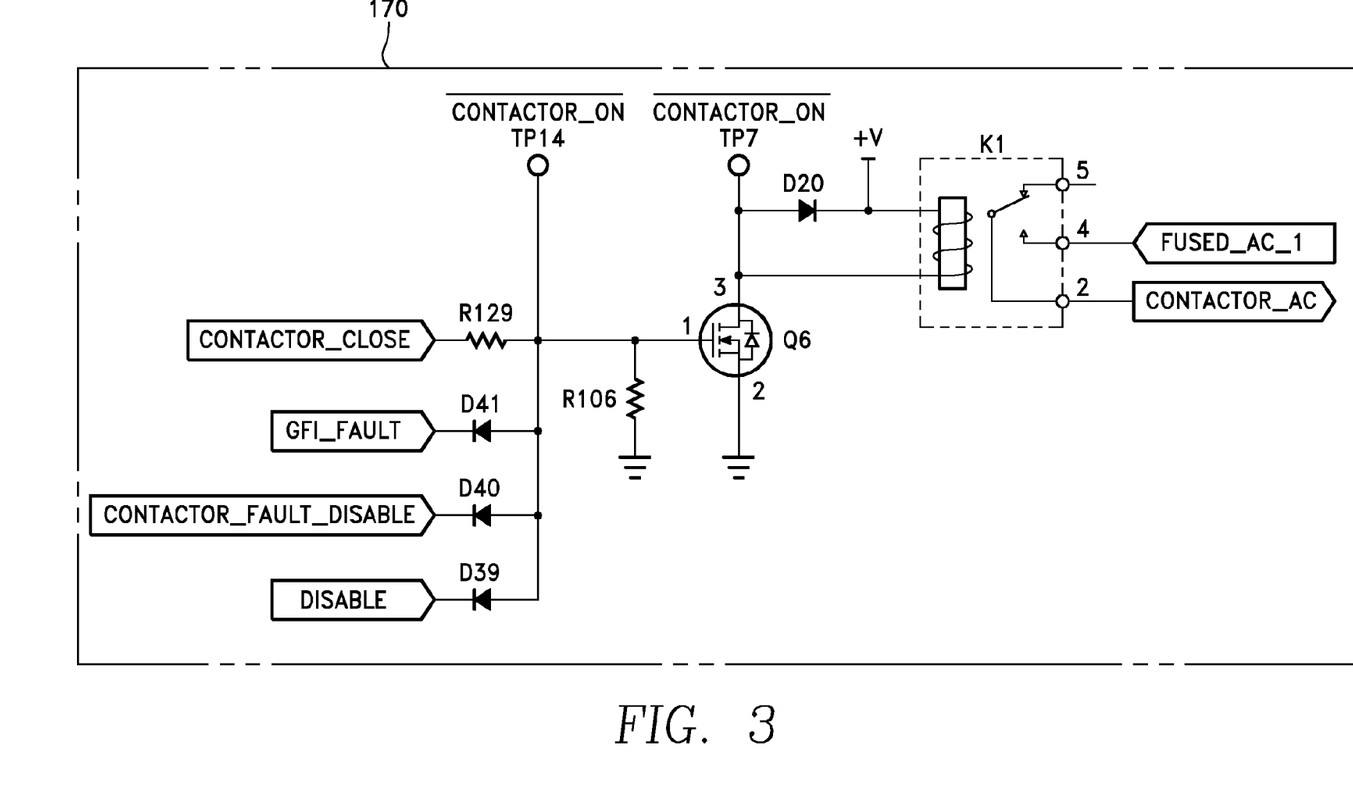
FIG. 3 shows a schematic view of a contactor control circuit.

FIG. 3 shows a schematic view of a contactor control circuit 170. The contactor control circuit 170 opens/closes the contactor 140 (FIG. 1) to disconnect/connect the utility power L1 and L2 from/to the vehicle connector 100c. As discussed above with reference to FIG. 2, the GFI_TRIP signal is output by the comparator 136 and is an input to the fault latch 138 to produce the GFI_FAULT signal. The GFI_FAULT signal output by the fault latch 138 is an input to the contactor control circuitry 170, shown in FIG. 3, used to control the contactor control relay K1. The contactor control relay K1 is used to open/close the contactor 140 (FIG. 1) to disconnect/connect the utility power L1 and L2 from/to the vehicle connector 100c. The CONTACTOR_AC signal output by the contactor control relay K1 is connected to the contactor coil 141 (FIG. 1) through pin 1 of the connector 181 (FIG. 1) associated with the utility present circuitry 180 (FIG. 1).

Figure 4:
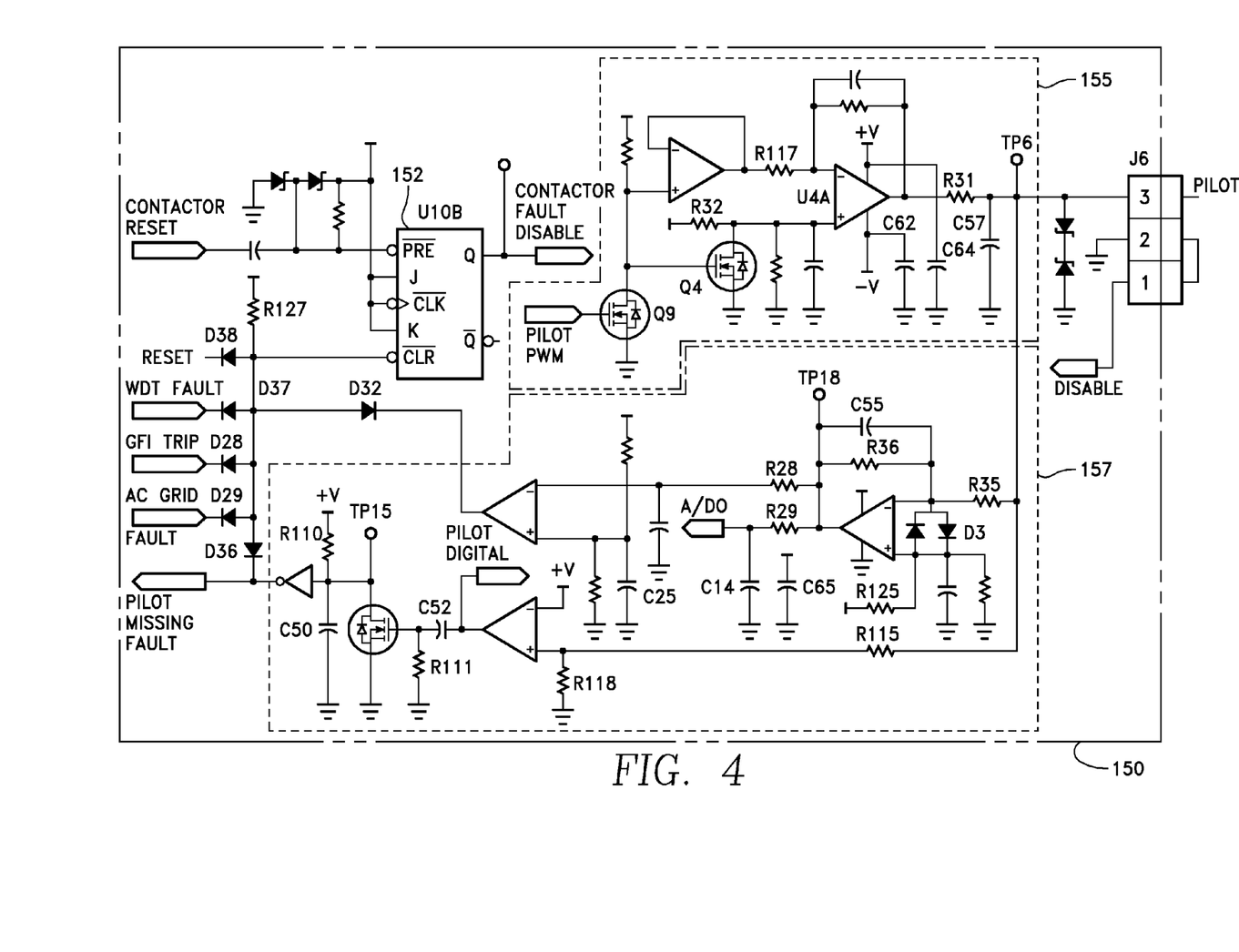
FIG. 4 shows an enlarged more complete schematic of the pilot circuitry shown in partial schematic in FIG. 1.

The GFI_TRIP signal output by the comparator 136 (FIG. 2) is not only provided to the contactor control circuit 170 (FIG. 3), but also is provided as an input to the contactor disable latch 152, shown in FIG. 4 to produce a CONTACTOR_FAULT_DISABLE signal. FIG. 4 shows an enlarged more complete schematic view of the pilot circuitry 150 shown in partial schematic in FIG. 1. Additionally, the contactor disable latch 152 (FIG. 4) is an input to the contactor control circuitry 170 (FIG. 3) to control the contactor control relay K1 (FIG. 3). The CONTACTOR_FAULT_DISABLE signal is used to open the contactor control relay K1 (FIG. 3), which opens the contactor 140 (FIG. 1) to open/close circuit the utility power L1 and L2. This provides a redundant circuit for this important safety control circuit. Further, it requires the reset of both latches 138 (FIG. 2) and 152 (FIG. 4) to reconnect L1 and L2 utility power to the vehicle connector 100c. This provides further software redundancy for this important safety control circuit.

Figure 5:
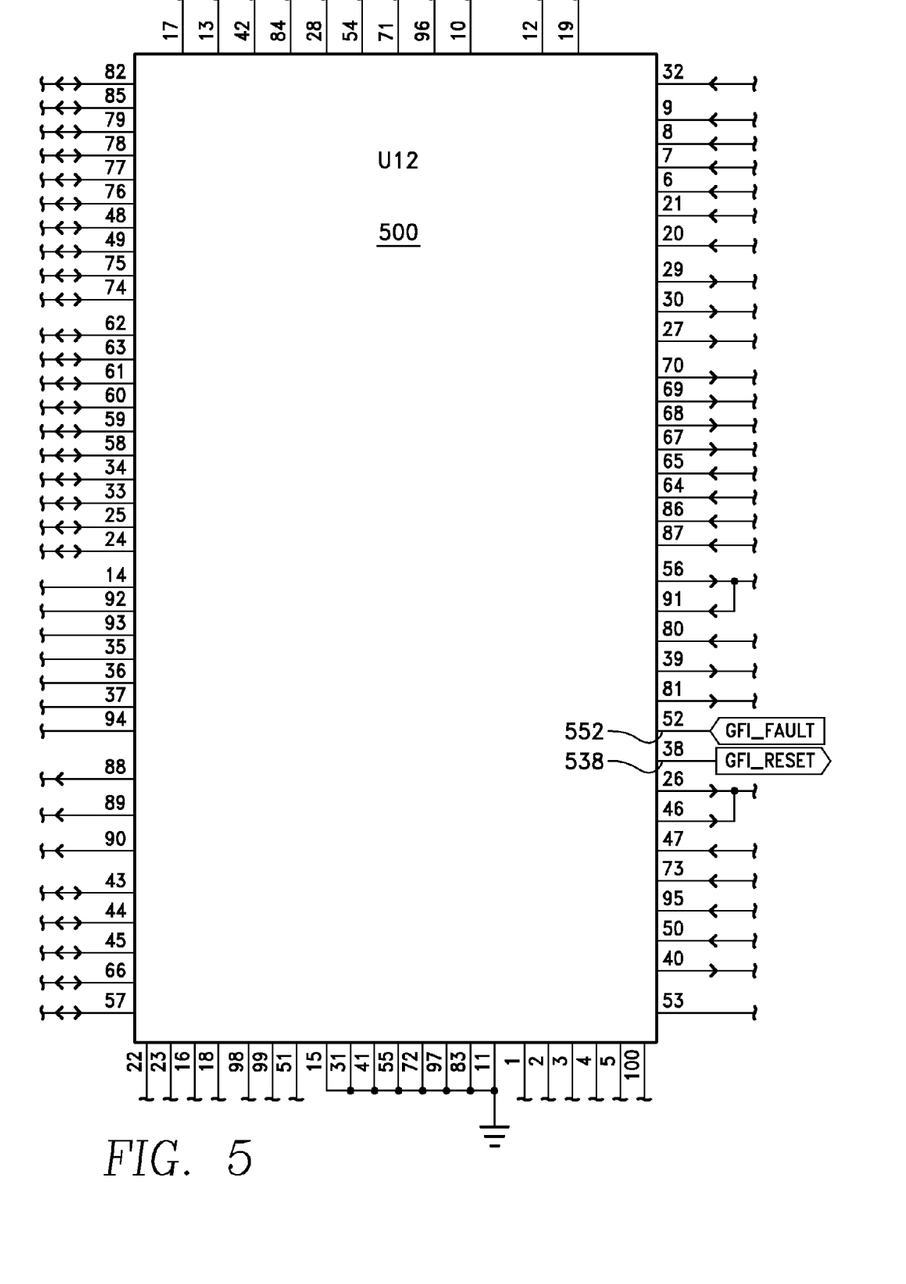
FIG. 5 is a partial schematic showing a microprocessor, which may be used to govern the output of the GFI circuit and/or the pilot signal circuit.

FIG. 5 is a partial schematic showing a microprocessor 500, which may be used to govern the output of the GFI circuit 130 (FIG. 2). Referring to FIGS. 2 and 5, the GFI_FAULT output signal from the fault latch 138 is provided as an input at pin 552 to the microprocessor 500. The microprocessor 500 outputs at pin 538 the GFI_RESET signal to the GFI circuit 130 to control the reset of the GFI circuit 130, in accordance with a predetermined standard, such as UL 2231. This may be accomplished by outputting the GFI_RESET signal to the fault latch 138, and to the CONTACTOR_RESET to the contactor disable latch 152 (FIG. 4).

Also, the microprocessor 500 may also output at pin 81 the GFI_TEST signal, which causes a GFI test circuit 139 to simulate a ground fault for testing the functionality of the contactor 140 (FIG. 1). The GFI test circuit 139 output AC_1 provides a path via pin 2 of the connector 181 to the contactor coil 141 (FIG. 1) to exercise the contactor 140.

Additionally, the microprocessor 500 provides a CONTACTOR_CLOSE signal output to the contactor close circuit to close the contactor control relay K1 (FIG. 3).

Further, the microprocessor 500 may provide signals to the pilot circuit, such as the PILOT_PWM discussed below with reference to FIGS. 7 and 8.

Figure 6:
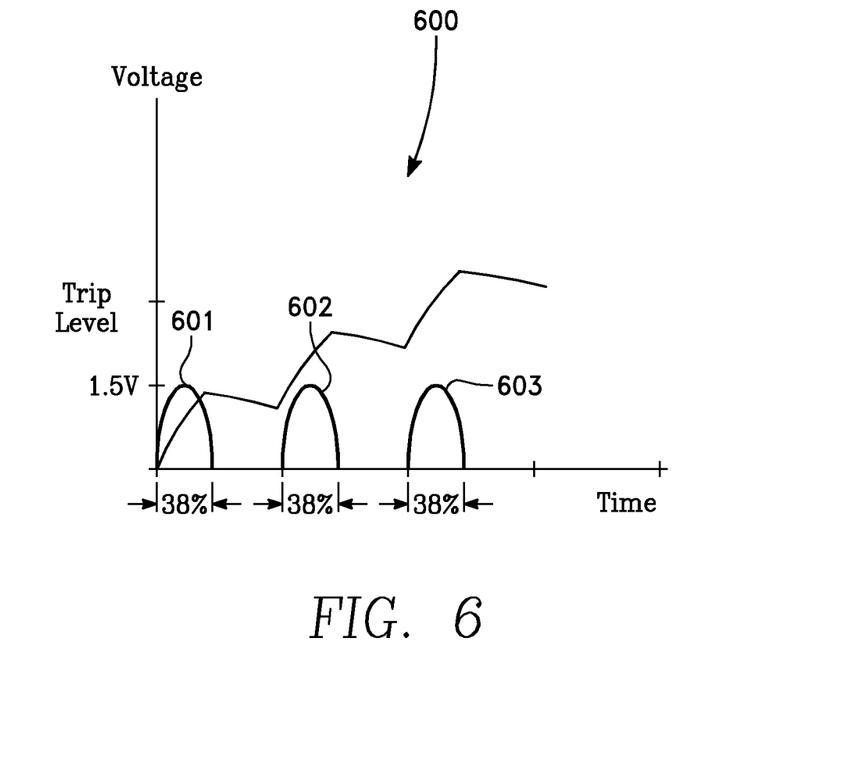
FIG. 6 shows a simplified plot of an example of possible charge accumulation by the double stage filter leading to a fault detection by the comparator.

FIG. 6 shows a simplified plot 600 of an example of possible charge accumulation by the double stage filter 134 (FIG. 2) leading to a fault detection by the comparator 136 (FIG. 2). Referring to FIGS. 2 and 6, since the double stage filter 134 discharges slower than it charges, several successive current pulse detections 601, 602, and 603 would be required to cause sufficient charge to accumulate a voltage level that would cause the comparator to indicate a GFI_TRIP. Thus, faults by spurious noise can be minimized. In this simplified example plot, a 1.5 volts pulse of about 38% of the duty cycle for three successive cycles causes sufficient charge to accumulate a GFI_TRIP signal. Other embodiments are possible by appropriate selection of the R102, R103, and C51.

Pilot Signal Circuit

FIGS. 1, 4, 5, and 7-8

In some embodiments a PILOT signal in accordance with the SAE J-1772 standard is provided. The SAE-J1772 standard, incorporated herein by reference in its entirety, requires precise voltage levels on the PILOT signal, which communicates a charge current command from the electric vehicle supply equipment system, illustrated in FIGS. 1-5, to the electric vehicle. A certain level of error is allowed but more precise signal sourcing provides a more confident operational profile. In various embodiments, the pilot signal generation circuit 150 generates a clean and precise PILOT signal. The pilot signal generation circuit 150 provides the PILOT signal via the connector 100c at the vehicle end of the cable 100. The pilot signal communicates information between the battery charger (not shown) in the vehicle and the electric power supply control system illustrated in FIGS. 1-5.

Figure 7:
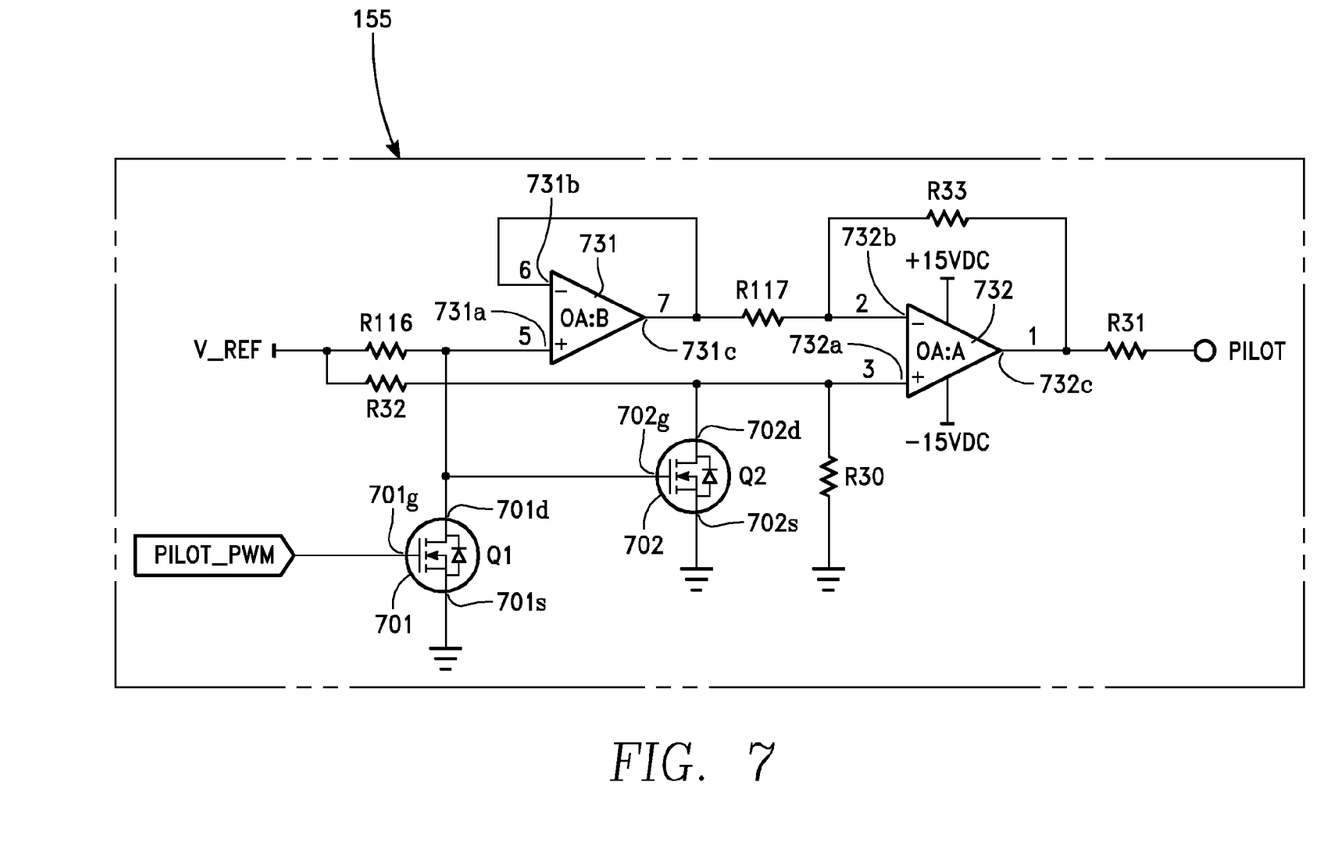
FIG. 7 is a simplified schematic diagram of a pilot signal generation circuit in accordance with one possible embodiment.
Figure 8:
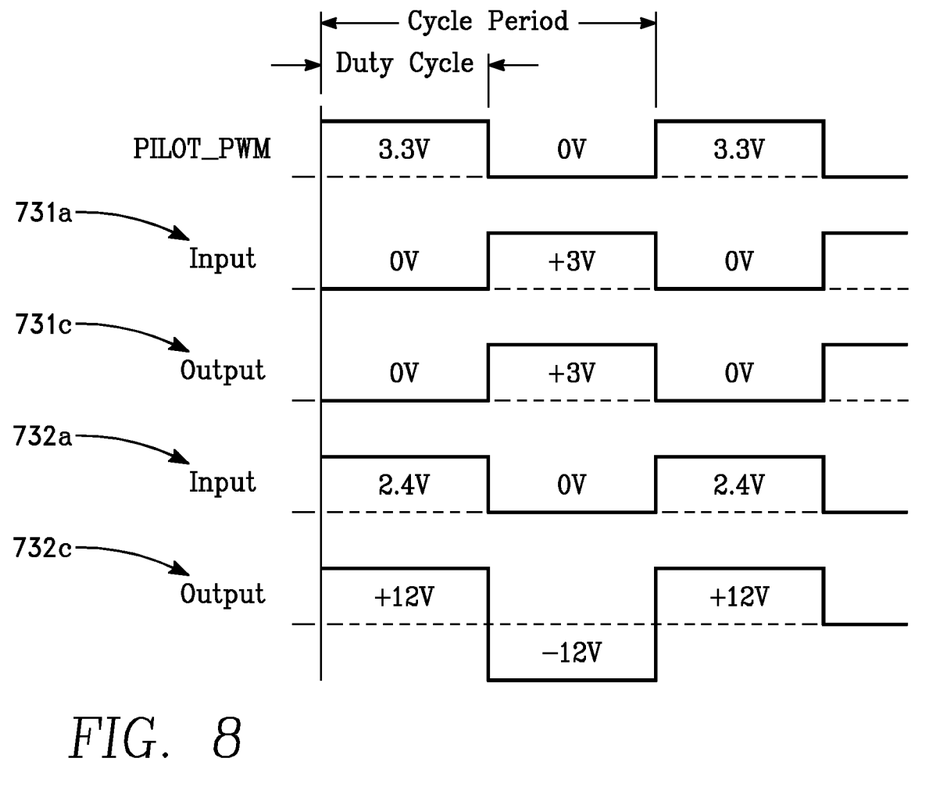
FIG. 8 is an example timing diagram of signals for the pilot circuit of FIG. 7.

FIG. 7 is a simplified schematic diagram of a pilot signal generation circuit 155 in accordance with one possible embodiment. FIG. 8 is an example timing diagram of signals for the pilot circuit 155 of FIG. 7. In the embodiment of FIG. 7, the PILOT signal is to be sourced at a value of from +12.0 Volts to −12.0 Volts in a pulse width modulated (PWM) square wave with a frequency of 1,000 Hz. A logic level pulse width modulated square wave PILOT_PWM signal controls the duty cycle and frequency. In the embodiment of FIG. 7 and the timing diagram illustrated in FIG. 8, the PILOT_PWM signal is a logic level signal of 0-3.3 Volts. The logic level signal PILOT_PWM may be any other voltage(s) depending on the embodiment. An absolute reference voltage V_REF provides the precision voltage value for the circuit 155. In this example V_REF is +3.0V. Operational amplifiers 731 and 732, and resistors R30-R32 and R116-R117 are used in conjunction with two Field Effect Transistors or FETs 701 and 702 to generate the final PILOT signal. In this example, the typical resistance values for R30-R32, R116, and R117 are given in ohms as 100K, 1.00K, 25.0K, 10.0K, and 25.0K, respectively, but the values can be altered to change the circuit 155 performance. In other embodiments, the transistors 701 and 702 may be another type, such as bipolar for example.

As shown in FIG. 7, the pilot signal generation circuit 155 has a first operational amplifier 731 having a non-inverting input connected via a first resistor R116 to receive a source reference voltage V_REF. The output 731c is directly connected to the inverting input 731b of the first operational amplifier. A second operational amplifier 732 has its non-inverting input 732a connected via a second resistor R32 to the source reference voltage V_REF. The non-inverting input 732a is also connected in parallel to ground or other reference voltage via resistor R30. The inverting input 732b is connected via a resistor R117 to the output 731c of the first operational amplifier. The output 732c connected via a resistor R33 to the inverting input 732b of the second operational amplifier 732.

Furthermore, the pilot signal generation circuit 155 has a first transistor 701 with its gate 701g connected to receive a logic level pulse width modulated control signal PILOT_PWM. The logic level pulse width modulated control signal PILOT_PWM may be supplied by the microprocessor 500 (FIG. 5). The drain 701d is connected to the non-inverting input 731a of the first operational amplifier 731, and the source 701s is connected to ground or other reference voltage. A second transistor 702 has a gate 702g connected to the drain 701d of the first transistor 701. The drain 702d of the second transistor 702 is connected to the non-inverting input 732a of the second operational amplifier 732, and the source 702s is connected to ground or other reference voltage.

Referring again to FIGS. 7 and 8, the PILOT_PWM signal may be a digital signal created by an external control source, such as a microprocessor 500 (FIG. 5). The logic level signal PILOT_PWM controls operation of the pilot signal generation circuit 155.

When the PILOT_PWM signal is low at the gate 701g of transistor 701, transistor 701 is open from drain 701d to source 701s. The voltage on transistor drain 701d then feeds into transistor gate 702g causing it to turn on, shorting its drain 702d to source 702s. In this condition, the input 731a of the first operational amplifier 731 has a high impedance +3.00 Volts applied to it, which is then buffered by the first operational amplifier 731 to provide a low impedance signal at +3.00 Volts for the second operational amplifier 732 to use as a signal source. Input 732a of the second operational amplifier 732 is held at 0 Volts by transistor 702. As a result, the output of 732c of the second operational amplifier 732 then has a negative voltage proportional to the gain of the second operational amplifier 732 circuit, specified by the ratio of R33 to R117; in this case, −12.00 Volts.

When the PILOT_PWM signal is high, 701 is shorted from drain 701d to source 701s. The 0 Volts on drain 701d of transistor 701 then feeds into gate 702g of transistor 702 causing it to be open from drain 702d to source 702s. In this condition, input 731a the first operational amplifier 731 has 0 Volts applied to it, which is then buffered by the first operational amplifier 731 to provide 0 Volts for the second operational amplifier 732 to use as a signal source at input 732b. Input 732a of the second operational amplifier 732 is fed by the +3.00 Volts reference V_REF and differentially amplified against the 0 Volts signal provided from output 731c. As a result, the output 732c of the second operational amplifier 732 has a positive voltage proportional to the gain of the second operational amplifier 732 circuit, specified by R33, R117, R30 and R32; in this case, +12.00 Volts.

Thus, by use of this circuit 155, a high or low logic level signal PILOT_PWM of imprecise voltage will provide a precise +12 Volt to −12 Volt square wave output suitable for use as the control communication signal source PILOT for the SAE-J1772 standard signal generation. Accuracy is only limited by component selection. Because this circuit 155 is absolute reference and amplifier regulated, the +/−12 volt signals are extremely accurate with no undesired component losses. This supports and enhances the application of the SAE J-1772 standard for reading the communication level control voltages without errors.

If the onboard charger sees a signal amplitude too low or too high, or improper frequency or pulse width within an expected range, it will shut off because it will assume that the integrity of the connection is bad. So it is important to have a precise PILOT signal.

In various embodiments of the pilot signal generation circuit 155, the operational amplifier 731 is configured to buffer the input 731a to the output 731c. The operational amplifier 732 is configured with resistors R30, R32, R33, and R117 as a differential amplifier. The transistor 701 is connected to the operational amplifier 731 to shunt the source reference voltage V_REF at the input 731a of the operational amplifier 731. The transistor 702 is connected to the operational amplifier 732 to shunt the source reference voltage V_REF at the input 732a of the operational amplifier 732 in response to a voltage level at the input 731a of the operation amplifier 731.

Thus, the pilot signal generation circuit 155 is configured to receive a logic level pulse width modulated signal PILOT_PWM at the input 701g of the transistor 701 and to provide a pulse width modulated bipolar signal PILOT at precision voltage levels at the output 732C of the second operational amplifier 732.

In various embodiments, the pilot generation circuit 155 is able to provide an output PILOT signal with precise voltage levels to within about 1% at +/−12 Volts.

The voltage of the PILOT signal will indicate the status of the connection between the cable 100 and the vehicle (not shown). In this example, a PILOT signal of +12 Volts indicates that the connector 100c is disconnected from the vehicle and not stowed. Optionally, a PILOT signal voltage of +11 Volts may be used to indicate that the connector 110c is stowed, at a charging station, for example. A PILOT signal voltage of +9 Volts indicates that the vehicle is connected. A PILOT signal voltage of +6 Volts indicates that the vehicle is charging without ventilation. A PILOT signal voltage of +3 Volts indicates that the vehicle is charging without ventilation. A PILOT signal voltage of 0 Volts indicates that there is a short or other fault. A PILOT signal voltage of −12 Volts indicates that there is an error onboard the vehicle.

A pilot detection circuit 157 within the pilot circuit 150 detects the voltages, generates, and provides a PILOT_DIGITAL signal to the microprocessor 500 (FIG. 5). The pilot detection circuit 157 also generates and provides a PILOT_MISSING_FAULT signal to the microprocessor 500 (FIG. 5). In response, the microprocessor 500 controls the connection of the utility power L1 and L2. For example, the microprocessor 500 can set the CONTACTOR CLOSE signal, discussed above, to cause the control contactor 170 to open the contactor 140 if a PILOT_MISSING_FAULT is detected.

It is worthy to note that any reference to "one embodiment" or "an embodiment" means that a particular feature, structure, or characteristic described in connection with the embodiment may be included in an embodiment, if desired. The appearances of the phrase "in one embodiment" in various places in the specification are not necessarily all referring to the same embodiment.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated.

Those skilled in the art will make modifications to the invention for particular applications of the invention.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

Having described this invention in connection with a number of embodiments, modification will now certainly suggest itself to those skilled in the art. The example embodiments herein are not intended to be limiting, various configurations and combinations of features are possible. As such, the invention is not limited to the disclosed embodiments, except as required by the appended claims.

What is claimed is:

1. A pilot signal generation circuit comprising:
   a) a buffer;
   b) a differential amplifier responsive to an output of the buffer;
   c) a first transistor connected to control a reference voltage at an input of the buffer in response to a pulse width modulated logic signal;
   d) a second transistor connected to control a reference voltage at an input of the differential amplifier based on the pulse width modulated logic signal such that the second transistor is connected so as to turn on when the first transistor is turned off and to turn off when the first transistor is turned on; and
   e) wherein the differential amplifier is configured to provide at an output a pilot signal proportional to a gain of the differential amplifier.

2. The pilot signal generation circuit of claim 1, wherein the second transistor is connected to an output of the first transistor so as to be responsive to the output of the first transistor to control the reference voltage at the input of the differential amplifier.

3. The pilot signal generation circuit of claim 2, wherein the first transistor and the second transistor are connected such that the reference voltage at the input of the differential amplifier is high when the reference voltage at the input of the buffer is low, and such that the reference voltage at the input of the differential amplifier is low when the reference voltage at the input of the buffer is high.

4. The pilot signal generation circuit of claim 1, wherein the first transistor and the second transistor are connected such that the reference voltage at the input of the differential amplifier is high when the reference voltage at the input of the buffer is low, and such that the reference voltage at the input of the differential amplifier is low when the reference voltage at the input of the buffer is high.

5. The pilot signal generation circuit of claim 1, wherein the reference voltage at the input of the buffer and the reference voltage at the input of the differential amplifier are connected via respective resistors to a common source reference voltage.

6. The pilot signal generation circuit of claim 5, wherein the second transistor is connected so as to respond to an output of the first transistor to control the reference voltage at the input of the differential amplifier based on the pulse width modulated logic signal.

* * * * *